(12) United States Patent
Pen-Liang

(10) Patent No.: US 6,207,531 B1
(45) Date of Patent: Mar. 27, 2001

(54) SHALLOW TRENCH ISOLATION USING UV/$O_3$ PASSIVATION PRIOR TO TRENCH FILL

(75) Inventor: Mao Pen-Liang, Hsinchu (TW)

(73) Assignees: ProMos Technologies, Inc.; Mosel Vitelic, Inc., both of Hsinchu (TW); Infineon Technologies AG, Muchen (DE)

( * ) Notice: Subject to any disclaimer, the term of this patent is extended or adjusted under 35 U.S.C. 154(b) by 0 days.

(21) Appl. No.: 09/346,977

(22) Filed: Jul. 2, 1999

(51) Int. Cl.$^7$ .................................................. H01L 21/76
(52) U.S. Cl. .................. 438/424; 438/769; 438/770; 438/219
(58) Field of Search .................. 438/221, 219, 438/400, 424, 769, 770, 771, 773, 774, 425, 427, 435, 426, 443, 259

(56) References Cited

U.S. PATENT DOCUMENTS 6,107,159 * 8/2000 Chuang ................................ 438/221

FOREIGN PATENT DOCUMENTS

| 0 119 553 A1 | 9/1984 | (EP) . |
| WO 96/28853 | 9/1996 | (WO) . |

OTHER PUBLICATIONS

Ohkubo et al, High Quality Ultra–Thin (4nm) Gate Oxide by UV/O3 Surface Pre–Treatment of Native Oxide, 1995 Symposium on VLSI Technology Digest of Technical Papers, p. 111–112.

* cited by examiner

Primary Examiner—Charles Bowers
Assistant Examiner—Yennhu B. Huynh
(74) Attorney, Agent, or Firm—Blakely, Sokoloff, Taylor, & Zafman LLP

(57) ABSTRACT

A method of forming a shallow trench isolation on a substrate is disclosed. The method comprises: forming a pad oxide layer on the substrate; forming a dielectric layer on the pad oxide layer; forming at least one trench in the substrate; forming an oxide liner along the walls and bottom of the trench, the oxide liner formed from a UV/$O_3$ process; and forming a CVD oxide layer for isolation atop the oxide liner and within the trench.

10 Claims, 2 Drawing Sheets

SHALLOW TRENCH ISOLATION USING UV/$O_3$ PASSIVATION PRIOR TO TRENCH FILL

TECHNICAL FIELD OF THE INVENTION

The present invention relates to a method of forming isolation for integrated circuits, and more specifically, to a method of forming a shallow trench isolation.

BACKGROUND OF THE INVENTION

In the formation of integrated circuits, the manufacture of isolation structures between semiconductor devices for insulating is crucial. In either ULSI or in VLSI, a tiny amount of leakage current can induce significant power dissipation for the entire circuit. Therefore, it is very important to form an effective isolation between semiconductor devices. In addition, with the trend towards higher density integration, effective isolation must be done in a smaller isolation space.

Presently, various isolation technologies have been proposed. These include: LOCOS (LOCal Oxidation of Silicon) and shallow trench isolation (STI) technologies. The most widely used method for forming isolation regions is the LOCOS structure. The LOCOS structure involves the formation of Field OXides (FOX) in the nonactive regions of the semiconductor substrate. In the other words, the FOX is created on the wafer that is not covered by a silicon nitride/silicon oxide composition layer. Unfortunately, the surface topography of the FOX cannot meet the stringent space demands of submicron devices. Additionally, as device geometry reaches submicron size, conventional LOCOS isolation has a further limitation. Notably, the bird's beak effect causes unacceptably large encroachment of the FOX into the device active regions.

Trench isolation is one of the newer approaches adopted and is used primarily for isolating devices in VLSI and ULSI. Trench isolation can be considered as a replacement for conventional LOCOS isolation. In the basic STI technology, a pad layer is first formed on the semiconductor wafer. The pad oxide layer may be formed by oxidizing a bare silicon wafer in a furnace to grow the pad oxide layer of about 100 to 250 angstroms thickness. The pad oxide layer is most typically formed from silicon dioxide.

Next, a furnace nitride layer of about 1500 to 2000 angstroms thickness is then deposited on the pad oxide layer. The silicon nitride layer is used as a stop layer and is formed on the pad oxide layer. A masking and etching step is then performed to form trenches about 0.4 to 0.5 μm in depth by anisotropically etched into the silicon wafer. Then, a CVD oxide is deposited onto the wafer and is subsequently planarized by CMP (chemical mechanical polishing) or etching back.

One drawback of conventional trench isolation is a relatively weak isolation due to the its oxide quality. As is well known in the art, the isolation formed by CVD is of poor quality. Therefore, an extra thermal process is often needed to density the oxide. Further, a thin liner oxide is frequently formed around the shallow trench when the conventional method is used. The thermal oxide process by definition requires a high temperature thermal cycle which depletes the thermal budget. Furthermore, the formation of the thermal oxide requires a relatively lengthy amount of time reducing throughput.

Thus, what is needed is an improved method for forming a shallow trench isolation without the need to form a thermal oxide layer.

SUMMARY OF THE INVENTION

A method of forming a shallow trench isolation on a substrate is disclosed. The method comprises: forming a pad oxide layer on said substrate; forming a dielectric layer on said pad oxide layer; forming at least one trench in said substrate; forming an oxide liner along the walls and bottom of said at least one trench, said oxide liner formed from a UV/$O_3$ process; and forming a CVD oxide layer for isolation atop said oxide liner and within said at least one trench.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
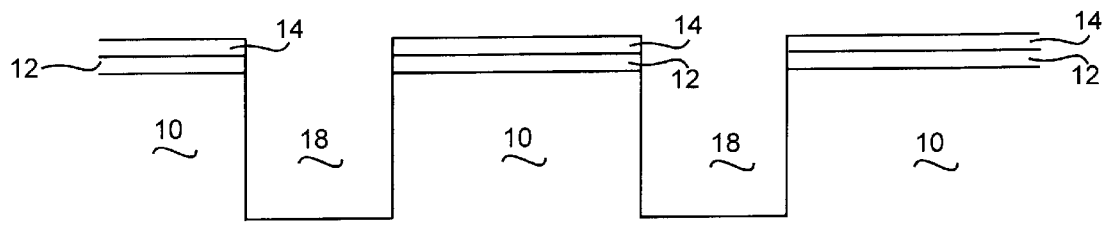
FIGS. 1–3 are cross-sectional views of a semiconductor substrate illustrating the steps of the present invention for forming a shallow trench isolation.

Referring to FIG. 1, a cross section of a semiconductor substrate is shown. In the preferred embodiment, the substrate 10 can be p-type or n-type silicon. A thin silicon dioxide layer 12 is formed on the substrate 10 to act as a pad oxide layer. The pad oxide layer 12 is typically formed by using a thermal oxidation in oxygen ambient or by any suitable oxide chemical compositions and procedures. In this embodiment, the thickness of the pad oxide layer 12 is approximately 200 angstroms. Subsequently, a $Si_3N_4$ layer (approximately 800 to 1700 angstroms) or a boron nitride (BN) layer (approximately 500 to 1000 angstroms) 14 is deposited on the pad oxide layer 12. Any suitable conventional process can be used to deposit the $Si_3N_4$ or BN layer 14. For example, low pressure chemical vapor deposition (LPCVD), plasma enhanced chemical vapor deposition (PECVD), or high density plasma chemical vapor deposition (HDPCVD) may be used.

Still referring to FIG. 1, a photoresist is patterned on the silicon nitride layer 14 to define the isolation region. One or more trenches 18 are formed by using an anisotropic dry etching technique. The $Si_3N_4$ or BN layer 14, the pad oxide layer 12, and the substrate 10 can respectively be etched away using conventional means. For example, the method used to remove portions of pad oxide layer 12 and silicon nitride ($Si_3N_4$) layer 14 may be wet etching using $CCl_2F_2$ solution as an etchant. The trenches 18 may be formed by etching the substrate using a gas mixture of $CClF_3$ and $Cl_2$ as an etchant. Typically, the depth of the shallow trench is about 5000 to 10000 angstroms from the surface of the $Si_3N_4$ or BN layer 14. The photoresist is then stripped away.

Figure 2:
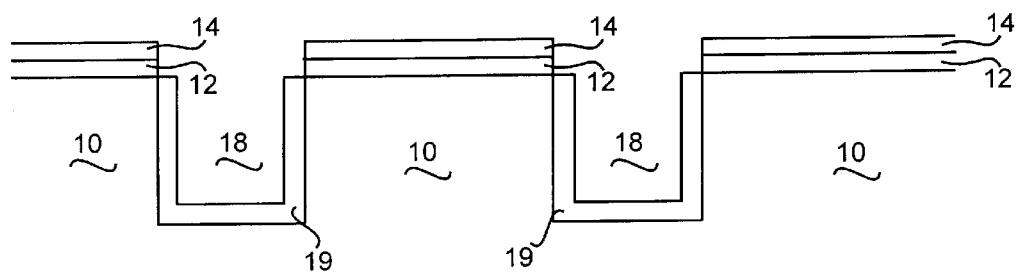

Next, turning to FIG. 2, an oxide liner 19 is formed by a UV/$O_3$ process of the native oxide along the walls of the trench 18. The formation of the oxide liner 19 using the UV/$O_3$ process is detailed in Ohkubo et al. "High Quality Ultra-Thin (4 nm) Gate Oxide by UV/$O_3$ Surface Pre-Treatment of Native Oxide", 1995 Symposium on VLSI Technology Digest of Technical Papers, Fujitsu Laboratories Ltd. Preferably, the thickness of the oxide liner 19 is between 30 and 200 angstroms thick. Further, preferably the $O_3$ volume ratio used in the process is on the order of 5% to 13% (i.e., $O_3/(O_3+O_2)$).

The oxide liner 19 made by the UV/$O_3$ process is shown to have excellent electrical properties such as good dielectric breakdown, low leakage current, and low surface states. Specifically, the oxide liner 19 has a density (as determined by grazing incidence x-ray reflectometry (GIXR)) that is very close to thermal oxide. Additionally, the UV/$O_3$ process needs only seconds to minutes to be completed. Compared to the hours spent in the thermal oxidization process currently used, the throughput will be significantly increased.

Figure 3:
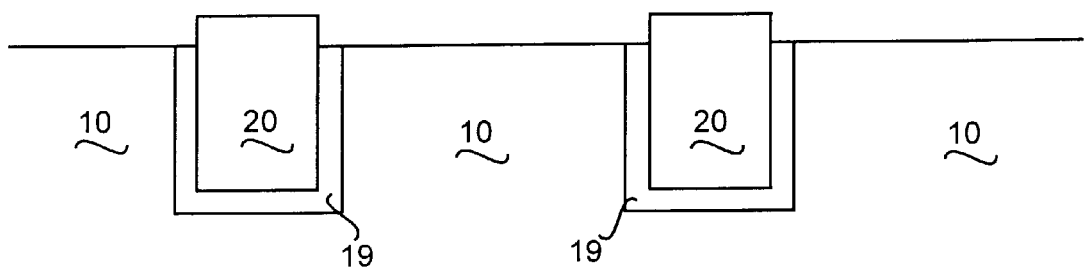

Next, turning to FIG. 3, an oxide layer 20 is formed by CVD on the oxide liner 19 and refilled into the trench 18. The oxide layer 20 formed by CVD is referred to as CVD oxide. The thickness of the CVD oxide layer 20 is about 8000 to 14000 angstroms. Alternatively, the oxide layer 20 may be a high density plasma CVD (HDPCVD) oxide layer such as that made possible by an Applied Materials Ultima apparatus.

Following the deposition of the oxide layer 20, the portion of the oxide layer 20 outside the trenches is removed by chemical mechanical polishing (CMP) using the $Si_3N_4$ or BN layer 14 as a stop layer. The $Si_3N_4$ or BN layer 14 is then removed by using a $H_3PO_4$ solution. Subsequently, the pad oxide layer 12 is then removed by using a diluted HF solution or a buffered oxide etching (BOE) solution. The resulting structure is shown in FIG. 3.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of forming a shallow trench isolation on a substrate, said method comprising:

forming a pad oxide layer on said substrate;

forming a dielectric layer on said pad oxide layer;

forming at least one trench in said substrate;

forming an oxide liner along the walls and bottom of said at least one trench, said oxide liner formed from a $UV/O_3$ process; and forming a CVD oxide layer for isolation atop said oxide liner and within said at least one trench.

2. The method of claim 1, further comprising:

removing said dielectric layer; and removing said pad oxide layer.

3. The method of claim 1, wherein said step of forming said at least one trench includes:

patterning a photoresist on said dielectric layer to define a trench region;

etching said dielectric layer and said pad oxide layer and said substrate by using said photoresist as a mask; and removing said photoresist.

4. The method of claim 1, wherein said pad oxide layer comprises silicon dioxide.

5. The method of claim 1, wherein said dielectric layer comprises $Si_3N_4$ or BN.

6. The method of claim 1, wherein said CVD oxide layer is formed by chemical vapor deposition.

7. The method of claim 1, wherein said CVD oxide layer is formed from HDPCVD oxide.

8. The method of claim 1, wherein said oxide liner has a thickness range from 30 Å to 200 Å.

9. The method of claim 8, wherein said oxide liner has a thickness range from 30 Å to 50 Å.

10. The method of claim 1, wherein said $UV/O_3$ process has a $O_3$ volume ratio on the order between 5 to 13 percent.

* * * * *